United States Patent [19]

Du et al.

[11] 4,393,479
[45] Jul. 12, 1983

[54] METHOD FOR ERASING DATA OF A NON-VOLATILE SEMICONDUCTOR MEMORY INTEGRATED CIRCUIT

[75] Inventors: Nguyen T. Du, Hatogaya; Akihide Asao, Ohita, both of Japan

[73] Assignee: Texas Instruments Incorporated, Dallas, Tex.

[21] Appl. No.: 207,179

[22] Filed: Nov. 17, 1980

[51] Int. Cl.³ ............................................. G11C 13/00
[52] U.S. Cl. ..................................... 365/218; 250/573
[58] Field of Search ................. 365/218, 154; 250/573

[56] References Cited

U.S. PATENT DOCUMENTS 3,731,119  5/1973  Matzem ............................... 365/154
3,833,824  9/1974  Parks ................................... 365/154

Primary Examiner—Terrell W. Fears
Attorney, Agent, or Firm—John G. Graham

[57] ABSTRACT

A non-volatile semiconductor integrated circuit has floating poly-silicon gates on the channel regions of memory cells. The information electronically stored in said floating gates is erased by the irradiation of an X-ray with predetermined amount. The writing step prior to X-ray irradiation causes the uniform erase of entire memory cells. The circuits other than memory cells are protected by a shielding coating against the X-ray irradiation.

3 Claims, 4 Drawing Figures

METHOD FOR ERASING DATA OF A NON-VOLATILE SEMICONDUCTOR MEMORY INTEGRATED CIRCUIT

BACKGROUND OF THE INVENTION

The present invention relates to a method for erasing data stored in a non-volatile semiconductor memory integrated circuit (IC), and more particularly to a method for erasing the data by irradiating an X-ray beam to memory cells.

Commonly used memory cells of a non-volatile memory IC which uses insulated gate transistors are ones in which data are stored by injecting charges from a semiconductor substrate into a trap of charge which is present in a single-layer or multi-layer gate insulation layer by tunneling effect and ones in which avalanche breakdown is caused at a P-N junction (between a source or drain and a substrate) of a semiconductor substrate surface in a floating gate of a semiconductor layer, e.g. poly-silicon layer, burried in a gate insulation layer so that high energy electrons or holes generated by the avalanche break-down are injected into the floating gate to store data.

In those non-volatile memory IC's, especially in electrically writable (programable) read-only memories (called EPROM), it is a currently used method to irradiate an ultraviolet ray to the memory cells prior to writing new data in order to impart energy to electrons injected in the floating gates to discharge the electrons to the underlying semiconductor substrate through an electric barrier of a gate oxide layer in order to erase the data.

However, since the ultra-violet ray has to enter into the memory cells in order to erase the data by the ultra-violet ray, the IC chip of the semiconductor memory is packaged by a lower casing (or a support substrate) of ceramic material and an upper casing having a glass window. As a result, in spite of the reduction of manufacturing costs of the IC, the cost of the entire memory device is high because of the package material cost and the assembling cost. In addition, in the ultra-violet ray erasing method, if opaque particles deposit on the IC chip, especially on the memory cells, the data in those memory cells may not be erased completely. Furthermore, the packaging process is complex and many parts are included so that many of the manufacturing cycles take longer time than those for a conventional plastic mold IC.

The present invention is directed to a method for erasing data of the non-volantile memory IC which eliminates the difficulties encountered in the ultra-violet ray erasing method, and it is an object of the present invention to allow to package the non-volatile memory IC by plastic material and to market a low cost IC.

It is another object of the present invention to simplify the packaging process of the non-volatile memory IC and to allow to market the non-volatile memory IC which requires shorter manufacturing time.

It is another object of the present invention to provide a method for uniformly erasing data in all of the memory cells irrespective of presence or absence of programmed data.

It is a still further object of the present invention to provide a method for completely erasing data irrespective of fine particles which may deposit or the surfaces of the memory cells.

BRIEF DESCRIPTION OF THE DRAWINGS

The present invention will now be described in detail with reference to the accompanying drawings.

DETAILED DESCRIPTION

Figure 1:
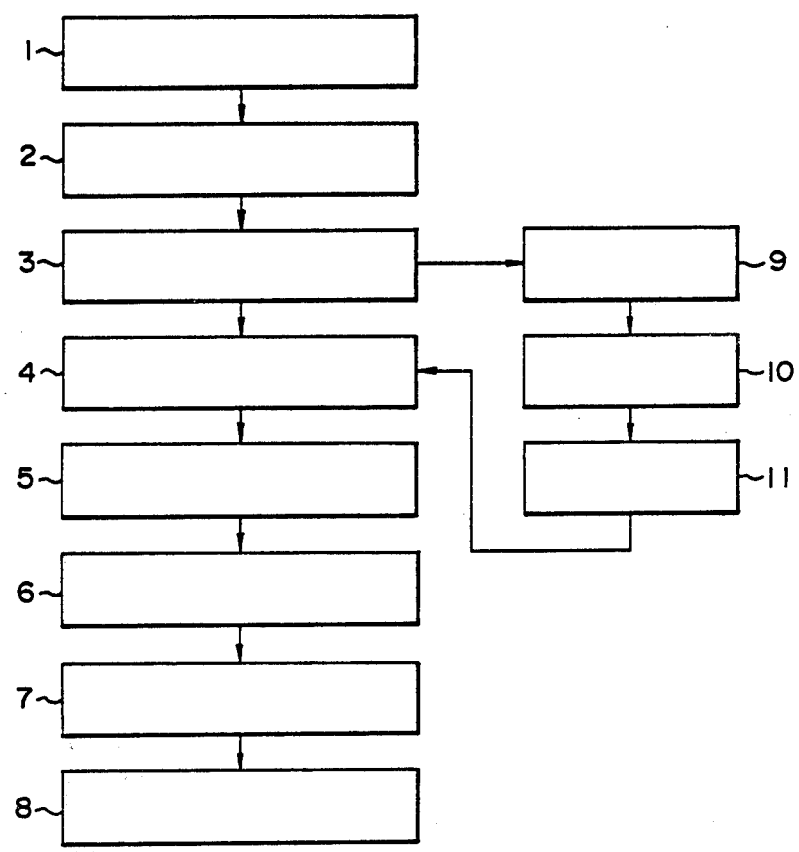
FIG. 1 shows a flow chart illustrating manufacturing steps of a non-volatile memory device used in the present invention.

FIG. 1 shows an example of manufacturing steps of a non-volatile memory device, specifically an EPROM, used in the present invention. In a preparation step 1, a silicon substrate having a (100) crystalline plane doped with a predetermined impurity material is prepared as a semiconductor substrate for an IC. The inventors of the present invention have experimentarily found that a substrate resistinity of the semiconductor substrate is an extremely important factor to the X-ray irradiation erasing method. This will be discussed hereinlater. Briefly, it has been found that the following conditions present preferable results for an N-channel insulated gate transistor (called NMOS) and a P-channel insulated gate transistor (called PMOS), respectively. That is, for the NMOS IC, it is preferable to use a P-type silicon substrate having a substrate resistivity ($\rho$) of no less than 10$\Omega$·cm at at least a memory cell area. The substrate resistinity may be controlled by appropriately selecting a concentration of boron to be doped in the silicon substrate. For the PMOS IC, there is no specific restriction for the substrate resistivity ($\rho$). The substrate resistivity may be controlled by appropriately selecting a concentration of phosphorus to be doped in the silicon substrate and/or controlling a concentration of a channel region of the insulated gate transistor by ion implantation.

In a complementary insulated gate transistor (CMOS) which includes both NMOS and PMOS, the above requirements should be met at the NMOS area.

In an IC manufacturing step 2, diffusion regions such as source and drain regions of the NOMOS or PMOS are formed on a major surface of the silicon substrate by a well-known method. In the non-volatile memory device, a number of memory cells arranged in rows and columns and peripheral circuits such as an address circuit for addressing the memory cells, a sense amplifier circuit for sensing data and a buffer circuit are simultaneously formed. Those circuit need not be modified for the purpose of the present invention and they may be designed depending on various requirements in the market. Each of the memory cells includes a floating gate formed by a thin gate insulation layer and a first poly-silicon layer on a channel region between the source and the drain, and a control electrode of a second poly-silicon layer formed on an insulation layer on the floating gate. The peripheral circuits include a number of conventional silicon gate transistors. Electrode interconnection on the IC chip may be poly-silicon layers or aluminum layers, but a metal having a large atomic number must not be used at at least the memory cell area in order to enhance the efficiency of the X-ray irradiation.

In a protective film forming step 3, a silicon nitride film or polyimid resin is deposited on the surface of the IC chip by plasma method as required. In the prior art ultra-violet ray erasing method, the use of the silicon nitride film for the EPROM was not allowed because of difficulty in transmitting the ultra-violet ray through the silicon nitride film, but in the present embodiment an optimum protective layer can be formed because no such problem exists.

In a back surface grinding step 4, a back surface (opposite to the surface on which the integrated circuit is formed) of the semiconductor substrate is ground and in a subsequent back surface electrode forming step 5, metal is deposited on the back surface of the silicon substrate.

The semiconductor substrate processed in the steps 1 through 5 is tested for the characteristic (in a characteristic test step 6) before it is divided into IC chips to complete a wafer processing stage.

Then, the IC wafer enters a packaging step 7. In this step, the IC wafer is divided into the IC chips which are then mounted on a lead frame except those IC chips of the IC wafers which did not pass the test step 6, and lead wires are connected to electrodes of the IC chips and plastic molds are applied. The mold material is conventional opaque plastic material for IC which does not transmit the ultra-violet ray therethrough. One of the important features of the present invention is that molding resin material which is much lower cost than that for the prior art ultra-violet erased EPROM can be used in the packaging step 7 and the assembling process time is shortened. Unlike the prior art method, there is no need for plating a lead pattern on a ceramic substrate nor bonding a transparent silicate glass plate on a ceramic casing. Accordingly, the simplified process results in further advantage of reducing a failure rate of the assembling process.

The IC chips passed through the packaging step 7 are then subjected to a final test step 8 which includes a temperature test and a bias test and then they are shipped. The programming of the EPROM is done by a user of the device. Alternatively, a programmed EPROM may be marketed.

In addition to those steps, a step for forming a shield layer which is hard to transmit the X-ray on the peripheral circuit area of the non-volatile memory device may be added. After the protective film forming step 3 shown in FIG. 1, aluminum (Al) or copper (Cu) is deposited on the entire surface of the IC wafer by vapor deposition to form a thin film of 2000 Å–3000 Å (in an Al vapor deposition step 9) and then the Al or Cu layer is selectively removed to expose the memory cell area and the bonding electrode area while covering the peripheral circuit area (in an Al selective removing step 10).

Then, lead (Pb) or a shielding layer containing a sufficient amount (e.g. 60%) of lead is deposited on the entire surface of the IC wafer (in a Pb plating step 11). In this step, the Pb layer is plated to only those areas to which the underlying metal or Al or Cu layer are deposited. The shielding layer need not be lead but it may be other metals such as gold (Au) or an insulative material layer. The thickness of the shielding metal may be appropriately selected depending on the intensity of the X-ray used to erase the data. In the present embodiment, a Pb based alloy layer having the thickness of 4 microns was used.

Figure 2:
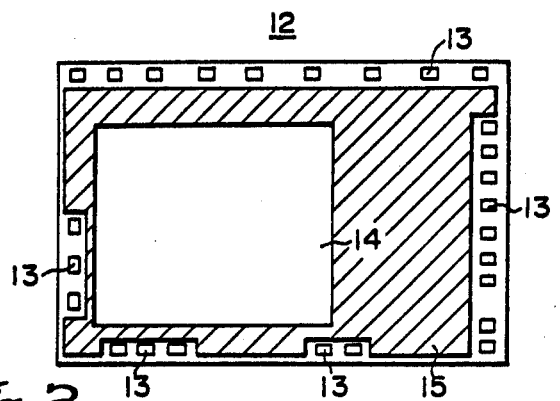
FIG. 2 shows a plan view of the memory device having a shielding layer deposited, used in the present invention.

FIG. 2 shows a plan view of a memory device 12 having a shielding layer deposited thereon. The shielding layer 15 is not deposited on bonding electrodes 13 on the periphery of the IC chip and a memory cell area 14 but the shielding layer 15 shown by hatched area is formed to cover peripheral circuits such as an address circuit, a sense amplifier circuit and a buffer circuit. The IC chip which passed through the shielding layer deposition step is finalized through the steps 4 to 8 as is the previous case.

Figure 3:
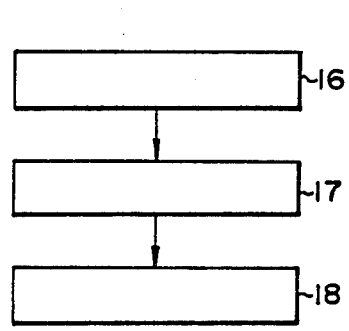
FIG. 3 illustrates a method for erasing data of the memory cells in accordance with the present invention.

In the present invention, the data stored in the memory cells are erased in the following manner. A programmed non-volatile memory device has electrons stored in the floating gates of selected ones of the memory cells. That is, logical "0's" have been written therein. Thus, as shown in FIG. 3, logical "0's" are written into all of the memory cells (in a all-memory cells write-in step 16) prior to the irradiation of the X-ray. This is carried out, like the write operation of the EPROM, by causing the avalanche break-down at the PN junction of either source or drain of the transistor of the memory cell to inject the electron of the electron-hole pair generated by the avalanche break-down into the floating gate. The selection of the electron is performed by applying a predetermined voltage to a second control electrode layer formed on the floating gate. Through the write-in step 16, all of the memory cells are conditioned equally so that they may be uniformly influenced by the irradiation of the X-ray.

Then, an X-ray irradiation step 17 is carried out. The non-volatile memory device is subjected to the irradiation of the X-ray of approximately $10^4$–$10^6$ Rads while it is covered by the opaque plastic mold. The X-ray may have a wavelength of 0.23–10 Å.

Figure 4:
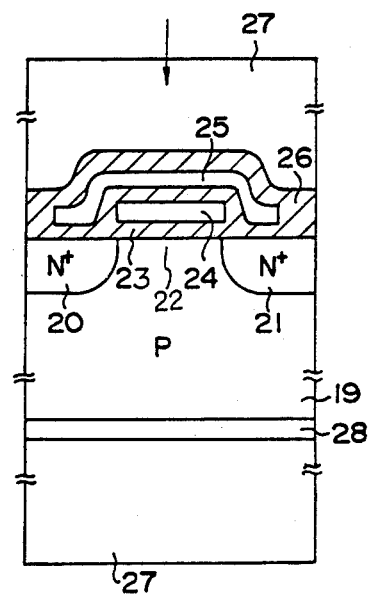
FIG. 4 shows a sectional view of a portion of EPROM which exemplifies a non-volatile memory cell.

FIG. 4 shows a portion of an EPROM, which is an example of the non-volatile memory cell. The memory cell comprises a P-type silicon substrate 19, source and drain regions 20 and 21 doped with N-type impurities, a thin gate oxide film 23 formed on a channel region 22, a poly-silicon floating gate 24 (completely surrounded by insulator), a control electrode 25 made of a second poly-silicon layer and a protective layer 26. Plastic resin mold 27 is formed thereon to the thickness of approximately 3 mm. The P-type silicon substrate 19 is connected to a lead frame 28. The drawing is diagrammatic and does not represent actual dimensions proportionally.

For erasing the data, the X-ray is irradiated to the surface of the IC on which the memory cells are formed in the direction shown by an arrow through the plastic mold 27. The intensity of the X-ray must be large enough for the X-ray to reach from the surface of the final product of the illustrated structure to the semiconductor substrate 19. The intensity of the irradiation is determined taking into the consideration of the X-ray absorption factors of the mold 27, the electrodes 24 and 25 and the insulating materials 23 and 26. By the X-ray irradiation, a number of hole-electron pairs are generated near the channel area 22 of the silicon substrate 19 (no N-channel being formed in this case because "0's" have been written), and they recombine with the electrons stored in the floating gates 24 so that the data is erased.

As described in connection with the step 16 of FIG. 3, since all of the memory cells are written (with logical "0's") under the same condition, a uniform erase is assured. If the X-ray should be irradiated to the programmed memory without conditioning, the memory cells having logical "0's" stored therein would be erased but the memory cells have their threshold voltages Vt changed so that ununiform erase might occur.

The X-ray irradiation time required for erasing depends on the intensity of the X-ray and generally ranges between 20 minutes and 30 minutes, which is not significantly different from that for the ultra-violet erasing method.

In the embodiment of the present invention, since the surface concentration of the silicon substrate material preparation step 1 shown in FIG. 1, the damage caused by the X-ray irradiation is eliminated in a thermal processing step 18 shown in FIG. 3. The thermal processing step 18 is carried out by leaving the memory device passed through the X-ray irradiation step 17 in an atmosphere of approximately 150° C. to 180° C. for about two hours. In the present invention, since the plastic molding material is used, the temperature of the thermal process must be below the permissible temperature for the material (below approximately 200° C.). In this sense, it is important to select the substrate resistivity of the semiconductor substrate in order to avoid the damage by the X-ray at a relatively low temperature of thermal process. For the P-type silicon substrate, a preferable range of the substrate resistivity is 12 to 16Ω·cm in order to recover the damage by the X-ray.

As explained above in conjunction with FIGS. 1 and 2, the damage by the X-ray of the peripheral circuits of the non-volatile memory IC can be avoided by covering the peripheral circuits by the shielding film 15 for the X-ray.

The present invention is not limited to the embodiment described above but the silicon substrate, memory cell structure, electrode material, protective film, material and thickness of the shielding film and intensity and time of the X-ray irradiation may be changed within the scope of the claim.

What is claimed is:

1. A method for erasing data of a floating-gate non-volatile semiconductor memory integrated circuit comprising the steps of writing data into memory cells of said memory integrated circuit by selectively charging the floating gates thereof and erasing such data by irradiating an X-ray beam at a wavelength of 0.23 to 10 Å to a dosage of approximately $10^4$ to $10^6$ Rads to said memory cells through a plastic package.

2. A method for erasing data of a non-volatile semiconductor memory integrated circuit according to claim 1, wherein a semiconductor surface of said memory integrated circuit comprises a P-type semiconductor having a substrate resistivity of no less than 10Ω·cm at at least gate area thereof.

3. A method for erasing data of a non-volatile semiconductor memory integrated circuit according to claim 1, wherein a shielding coating for the X-ray beam is applied on a peripheral circuit other than the memory cells of said memory integrated circuit.

* * * * *